United States Patent
Hahn et al.

(10) Patent No.: US 9,819,325 B2
(45) Date of Patent: Nov. 14, 2017

(54) TIME DELAY FILTERS

(71) Applicant: Kumu Networks, Inc., Sunnyvale, CA (US)

(72) Inventors: Wilhelm Steffen Hahn, Sunnyvale, CA (US); Alfred Riddle, Sunnyvale, CA (US); Ernie Landi, Sunnyvale, CA (US)

(73) Assignee: Kumu Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/382,335

(22) Filed: Dec. 16, 2016

(65) Prior Publication Data

US 2017/0179916 A1    Jun. 22, 2017

Related U.S. Application Data

(60) Provisional application No. 62/268,408, filed on Dec. 16, 2015.

(51) Int. Cl.
*H03H 7/32* (2006.01)
*H03H 7/01* (2006.01)

(52) U.S. Cl.
CPC .......... *H03H 7/32* (2013.01); *H03H 7/0115* (2013.01)

(58) Field of Classification Search
CPC .......... H01P 1/10; H01P 1/20381; H03H 7/32
(Continued)

(56) References Cited

U.S. PATENT DOCUMENTS 3,922,617 A    11/1975    Denniston et al.
4,321,624 A    3/1982    Gibson et al.
(Continued)

FOREIGN PATENT DOCUMENTS

EP    0755141    10/1998
EP    1959625    8/2008
(Continued)

OTHER PUBLICATIONS

Bharadia et al., "Full Duplex Radios" SIGOMM, Aug. 12-16, 2013, Hong Kong, China, Copyright 2013 ACM 978-1-4503-2056-6/6/13/08, 12 pages.
(Continued)

*Primary Examiner* — Dean Takaoka
(74) *Attorney, Agent, or Firm* — Jeffrey Schox; Thomas Gwinn

(57) ABSTRACT

A time delay filter comprising a substrate comprising a first surface and a second surface opposite the first surface; a first LC resonator coupled to the substrate and comprising a first coupling point, a first capacitive element electrically coupled between the first coupling point and the first conductive region, and a first inductive element coupled between the first coupling point and the first conductive region, and comprising a first and second inductor tap; and a second LC resonator coupled to the substrate and comprising a second coupling point, a second capacitive element electrically coupled between the second coupling point and the first conductive region, and a second inductive element electrically coupled between the second coupling point and the first conductive region wherein the system group delays a signal output at a second coupling point relative to a signal input at the first coupling point.

19 Claims, 11 Drawing Sheets

(58) Field of Classification Search
USPC .............. 333/101, 166, 175, 294, 205, 204
See application file for complete search history.

(56) References Cited

U.S. PATENT DOCUMENTS

| | | | |
|---|---|---|---|
| 4,395,688 A | 7/1983 | Sellers | |
| 4,952,193 A | 8/1990 | Talwar | |
| 5,027,253 A | 6/1991 | Lauffer et al. | |
| 5,212,827 A | 5/1993 | Meszko et al. | |
| 5,262,740 A * | 11/1993 | Willems | H01P 5/10 |
| | | | 333/238 |
| 5,278,529 A * | 1/1994 | Willems | H01P 1/20381 |
| | | | 333/110 |
| 5,691,978 A | 11/1997 | Kenworthy | |
| 5,734,305 A * | 3/1998 | Ervasti | H01P 7/00 |
| | | | 333/175 |
| 5,734,967 A | 3/1998 | Kotzin et al. | |
| 5,790,658 A | 8/1998 | Yip et al. | |
| 5,818,385 A | 10/1998 | Bartholomew | |
| 5,930,301 A | 7/1999 | Chester et al. | |
| 6,037,848 A * | 3/2000 | Alila | H01P 1/205 |
| | | | 333/202 |
| 6,215,812 B1 | 4/2001 | Young et al. | |
| 6,240,150 B1 | 5/2001 | Darveau et al. | |
| 6,307,169 B1 * | 10/2001 | Sun | B81B 3/0008 |
| | | | 200/181 |
| 6,411,250 B1 | 6/2002 | Oswald et al. | |
| 6,539,204 B1 | 3/2003 | Marsh et al. | |
| 6,567,649 B2 | 5/2003 | Souissi | |
| 6,580,771 B2 | 6/2003 | Kenney | |
| 6,583,021 B2 | 6/2003 | Song | |
| 6,612,987 B2 | 9/2003 | Morsy et al. | |
| 6,639,551 B2 | 10/2003 | Li et al. | |
| 6,657,950 B1 | 12/2003 | Jones, IV et al. | |
| 6,686,879 B2 | 2/2004 | Shattil | |
| 6,725,017 B2 | 4/2004 | Blount et al. | |
| 6,784,766 B2 * | 8/2004 | Allison | H01P 1/203 |
| | | | 333/204 |
| 6,815,739 B2 | 11/2004 | Huff et al. | |
| 6,907,093 B2 | 6/2005 | Blount et al. | |
| 6,915,112 B1 | 7/2005 | Sutton et al. | |
| 6,965,657 B1 | 11/2005 | Rezvani et al. | |
| 6,975,186 B2 * | 12/2005 | Hirabayashi | H01P 1/203 |
| | | | 333/185 |
| 6,985,705 B2 | 1/2006 | Shohara | |
| 7,057,472 B2 | 6/2006 | Fukamachi et al. | |
| 7,139,543 B2 | 11/2006 | Shah | |
| 7,177,341 B2 | 2/2007 | McCorkle | |
| 7,228,104 B2 | 6/2007 | Collins et al. | |
| 7,230,316 B2 | 6/2007 | Yamazaki et al. | |
| 7,239,219 B2 | 7/2007 | Brown et al. | |
| 7,266,358 B2 | 9/2007 | Hillstrom | |
| 7,302,024 B2 | 11/2007 | Arambepola | |
| 7,336,128 B2 | 2/2008 | Suzuki et al. | |
| 7,336,940 B2 | 2/2008 | Smithson | |
| 7,348,844 B2 | 3/2008 | Jaenecke | |
| 7,349,505 B2 | 3/2008 | Blount et al. | |
| 7,362,257 B2 | 4/2008 | Bruzzone et al. | |
| 7,372,420 B1 | 5/2008 | Osterhues et al. | |
| 7,397,843 B2 | 7/2008 | Grant et al. | |
| 7,426,242 B2 | 9/2008 | Thesling | |
| 7,468,642 B2 * | 12/2008 | Bavisi | H03H 7/0115 |
| | | | 333/168 |
| 7,508,898 B2 | 3/2009 | Cyr et al. | |
| 7,509,100 B2 | 3/2009 | Toncich | |
| 7,622,989 B2 | 11/2009 | Tzeng et al. | |
| 7,667,557 B2 * | 2/2010 | Chen | H03H 1/00 |
| | | | 333/175 |
| 7,706,755 B2 | 4/2010 | Muhammad et al. | |
| 7,733,813 B2 | 6/2010 | Shin et al. | |
| 7,773,759 B2 | 8/2010 | Alves et al. | |
| 7,773,950 B2 | 8/2010 | Wang et al. | |
| 7,778,611 B2 | 8/2010 | Asai et al. | |
| 7,869,527 B2 | 1/2011 | Vetter et al. | |
| 7,948,878 B2 | 5/2011 | Briscoe et al. | |
| 7,962,170 B2 | 6/2011 | Axness et al. | |
| 7,987,363 B2 | 7/2011 | Chauncey et al. | |
| 7,990,231 B2 * | 8/2011 | Morikaku | H01P 9/00 |
| | | | 333/138 |
| 7,999,715 B2 | 8/2011 | Yamaki et al. | |
| 8,005,235 B2 | 8/2011 | Rebandt, II et al. | |
| 8,023,438 B2 | 9/2011 | Kangasmaa et al. | |
| 8,027,642 B2 | 9/2011 | Proctor, Jr. et al. | |
| 8,031,744 B2 | 10/2011 | Radunovic et al. | |
| 8,032,183 B2 | 10/2011 | Rudrapatna | |
| 8,055,235 B1 | 11/2011 | Gupta et al. | |
| 8,060,803 B2 | 11/2011 | Kim | |
| 8,081,695 B2 | 12/2011 | Chrabieh et al. | |
| 8,085,831 B2 | 12/2011 | Teague | |
| 8,086,191 B2 | 12/2011 | Fukuda et al. | |
| 8,090,320 B2 | 1/2012 | Dent et al. | |
| 8,093,963 B2 * | 1/2012 | Yamashita | H01P 1/203 |
| | | | 333/134 |
| 8,155,046 B2 | 4/2012 | Jung et al. | |
| 8,155,595 B2 | 4/2012 | Sahin et al. | |
| 8,160,176 B2 | 4/2012 | Dent et al. | |
| 8,175,535 B2 | 5/2012 | Mu | |
| 8,179,990 B2 | 5/2012 | Orlik et al. | |
| 8,218,697 B2 | 7/2012 | Guess et al. | |
| 8,270,456 B2 | 9/2012 | Leach et al. | |
| 8,274,342 B2 | 9/2012 | Tsutsumi et al. | |
| 8,306,480 B2 | 11/2012 | Muhammad et al. | |
| 8,325,001 B2 | 12/2012 | Huang et al. | |
| 8,331,477 B2 | 12/2012 | Huang et al. | |
| 8,345,433 B2 | 1/2013 | White et al. | |
| 8,349,933 B2 | 1/2013 | Bhandari et al. | |
| 8,351,533 B2 | 1/2013 | Shrivastava et al. | |
| 8,378,763 B2 * | 2/2013 | Wakata | H01P 1/20345 |
| | | | 333/175 |
| 8,385,855 B2 | 2/2013 | Lorg et al. | |
| 8,385,871 B2 | 2/2013 | Wyville | |
| 8,391,878 B2 | 3/2013 | Tenny | |
| 8,410,871 B2 * | 4/2013 | Kim | H01P 1/20336 |
| | | | 333/205 |
| 8,417,750 B2 | 4/2013 | Yan et al. | |
| 8,422,540 B1 | 4/2013 | Negus et al. | |
| 8,428,542 B2 | 4/2013 | Bornazyan | |
| 8,446,892 B2 | 5/2013 | Ji et al. | |
| 8,457,549 B2 | 6/2013 | Weng et al. | |
| 8,462,697 B2 | 6/2013 | Park et al. | |
| 8,467,757 B2 | 6/2013 | Ahn | |
| 8,498,585 B2 | 7/2013 | Vandenameele | |
| 8,502,924 B2 | 8/2013 | Liou et al. | |
| 8,509,129 B2 | 8/2013 | Deb et al. | |
| 8,521,090 B2 | 8/2013 | Kim et al. | |
| 8,576,752 B2 | 11/2013 | Sarca | |
| 8,611,401 B2 | 12/2013 | Lakkis | |
| 8,619,916 B2 | 12/2013 | Jong | |
| 8,625,686 B2 | 1/2014 | Li et al. | |
| 8,626,090 B2 | 1/2014 | Dalipi | |
| 8,649,417 B2 | 2/2014 | Baldemair et al. | |
| 8,711,943 B2 | 4/2014 | Rossato et al. | |
| 8,744,377 B2 | 6/2014 | Rimini et al. | |
| 8,750,786 B2 | 6/2014 | Larsson et al. | |
| 8,755,756 B1 | 6/2014 | Zhang et al. | |
| 8,767,869 B2 | 7/2014 | Rimini et al. | |
| 8,787,907 B2 | 7/2014 | Jain et al. | |
| 8,798,177 B2 | 8/2014 | Park et al. | |
| 8,804,975 B2 | 8/2014 | Harris et al. | |
| 8,837,332 B2 | 9/2014 | Khojastepour et al. | |
| 8,842,584 B2 | 9/2014 | Jana et al. | |
| 8,879,433 B2 | 11/2014 | Khojastepour et al. | |
| 8,879,811 B2 | 11/2014 | Liu et al. | |
| 8,913,528 B2 | 12/2014 | Cheng et al. | |
| 8,929,550 B2 | 1/2015 | Shattil et al. | |
| 8,995,410 B2 | 3/2015 | Balan et al. | |
| 9,014,069 B2 | 4/2015 | Patil et al. | |
| 9,019,849 B2 | 4/2015 | Hui et al. | |
| 9,031,567 B2 | 5/2015 | Haub | |
| 9,042,838 B2 | 5/2015 | Braithwaite | |
| 9,054,795 B2 | 6/2015 | Choi et al. | |
| 9,065,519 B2 | 6/2015 | Cyzs et al. | |
| 9,077,421 B1 | 7/2015 | Mehlman et al. | |
| 9,112,476 B2 | 8/2015 | Basaran et al. | |

(56) References Cited

U.S. PATENT DOCUMENTS

| | | |
|---|---|---|
| 9,124,475 B2 | 9/2015 | Li et al. |
| 9,130,747 B2 | 9/2015 | Zinser et al. |
| 9,136,883 B1 | 9/2015 | Moher et al. |
| 9,160,430 B2 | 10/2015 | Maltsev et al. |
| 9,184,902 B2 | 11/2015 | Khojastepour et al. |
| 9,185,711 B2 | 11/2015 | Lin et al. |
| 9,231,647 B2 | 1/2016 | Polydoros et al. |
| 9,231,712 B2 | 1/2016 | Hahn et al. |
| 9,236,996 B2 | 1/2016 | Khandani |
| 9,264,024 B2 | 2/2016 | Shin et al. |
| 9,312,895 B1 | 4/2016 | Gupta et al. |
| 9,325,432 B2 | 4/2016 | Hong et al. |
| 9,331,737 B2 | 5/2016 | Hong et al. |
| 9,413,500 B2 | 8/2016 | Chincholi et al. |
| 9,413,516 B2 | 8/2016 | Khandani |
| 9,461,698 B2 | 10/2016 | Moffatt et al. |
| 9,490,963 B2 | 11/2016 | Choi et al. |
| 9,537,543 B2 | 1/2017 | Choi |
| 2002/0154717 A1 | 10/2002 | Shima et al. |
| 2003/0022395 A1 | 1/2003 | Olds |
| 2004/0106381 A1 | 6/2004 | Tiller |
| 2005/0250466 A1 | 11/2005 | Varma et al. |
| 2006/0058022 A1 | 3/2006 | Webster et al. |
| 2007/0207747 A1 | 9/2007 | Johnson et al. |
| 2007/0249314 A1 | 10/2007 | Sanders et al. |
| 2008/0131133 A1 | 6/2008 | Blunt et al. |
| 2008/0219377 A1 | 9/2008 | Nisbet |
| 2010/0103900 A1 | 4/2010 | Yeh et al. |
| 2010/0136900 A1 | 6/2010 | Seki |
| 2010/0215124 A1 | 8/2010 | Zeong et al. |
| 2010/0226448 A1 | 9/2010 | Dent |
| 2011/0013684 A1 | 1/2011 | Semenov et al. |
| 2011/0026509 A1 | 2/2011 | Tanaka |
| 2011/0256857 A1 | 10/2011 | Chen et al. |
| 2012/0140685 A1 | 6/2012 | Lederer et al. |
| 2012/0147790 A1 | 6/2012 | Khojastepour et al. |
| 2012/0154249 A1 | 6/2012 | Khojastepour et al. |
| 2012/0201153 A1 | 8/2012 | Bharadia et al. |
| 2012/0201173 A1 | 8/2012 | Jain et al. |
| 2012/0224497 A1 | 9/2012 | Lindoff et al. |
| 2013/0166259 A1 | 6/2013 | Weber et al. |
| 2013/0207745 A1 | 8/2013 | Yun et al. |
| 2013/0253917 A1 | 9/2013 | Schildbach |
| 2013/0301487 A1 | 11/2013 | Khandani |
| 2014/0011461 A1 | 1/2014 | Bakalski et al. |
| 2014/0169236 A1 | 6/2014 | Choi et al. |
| 2014/0313946 A1 | 10/2014 | Azadet |
| 2014/0348018 A1 | 11/2014 | Bharadia et al. |
| 2014/0348032 A1 | 11/2014 | Hua et al. |
| 2015/0139122 A1 | 5/2015 | Rimini et al. |
| 2015/0188646 A1 | 7/2015 | Bharadia et al. |
| 2015/0215937 A1 | 7/2015 | Khandani |
| 2015/0303984 A1 | 10/2015 | Braithwaite |
| 2016/0218769 A1 | 7/2016 | Chang et al. |

FOREIGN PATENT DOCUMENTS

| | | |
|---|---|---|
| EP | 2237434 | 10/2010 |
| EP | 2267946 | 3/2014 |
| RU | 2256985 | 7/2005 |
| WO | 2013173250 | 11/2013 |
| WO | 2013185106 | 12/2013 |
| WO | 2014093916 | 6/2014 |

OTHER PUBLICATIONS

McMichael et al., "Optimal Tuning of Analog Self-Interference Cancellers for Full-Duple Wireless Communication", Oct. 1-5, 2012, Fiftieth Annual Allerton Conference, Illinois, USA, pp. 246-251.

\* cited by examiner

TIME DELAY FILTERS

CROSS-REFERENCE TO RELATED APPLICATIONS

This application claims the benefit of U.S. Provisional Application Ser. No. 62/268,408, filed on 16 Dec. 2015, which is incorporated in its entirety by this reference.

TECHNICAL FIELD

This invention relates generally to the field of analog circuits, and more specifically to new and useful time delay filters.

BACKGROUND

Time delay elements are used in a variety of analog circuits to cause analog signals to experience a time delay. In particular, time delay elements are particularly important for RF transceivers, where they may be used for amplifier pre-distortion, feed-forward linearization, and active interference cancellation techniques. Of course, such time delay elements may find use in a wide variety of applications involving analog signal transmission, processing, and/or synthesis.

Unfortunately, traditional delay elements (e.g., ceramic filters, SAW filters, coaxial cables, waveguide cavity resonator-based filters) may limit the performance of analog circuits; in particular, RF transceivers, due to one or more of the following problems: excessive size, excessive cost, excessive complexity, poor manufacturability, lack of adjustability, high loss, high amplitude ripple, or high phase ripple.

Thus, there is a need in the field of analog circuits to create new and useful time delay filters. This invention provides such new and useful filters.

DESCRIPTION OF THE PREFERRED EMBODIMENTS

The following description of the preferred embodiments of the invention is not intended to limit the invention to these preferred embodiments, but rather to enable any person skilled in the art to make and use this invention.

The systems described herein may increase performance of full-duplex transceivers (and other applicable systems) by enabling high accuracy time delay filtering without prohibitive increases in circuit complexity and/or cost. Other applicable systems include active sensing systems (e.g., RADAR), wired communications systems, wireless communications systems, channel emulators, reflectometers, PIM analyzers and/or any other suitable system, including communication systems where transmit and receive bands are close in frequency, but not overlapping.

1. Time Delay Filter Systems

Figure 1A:
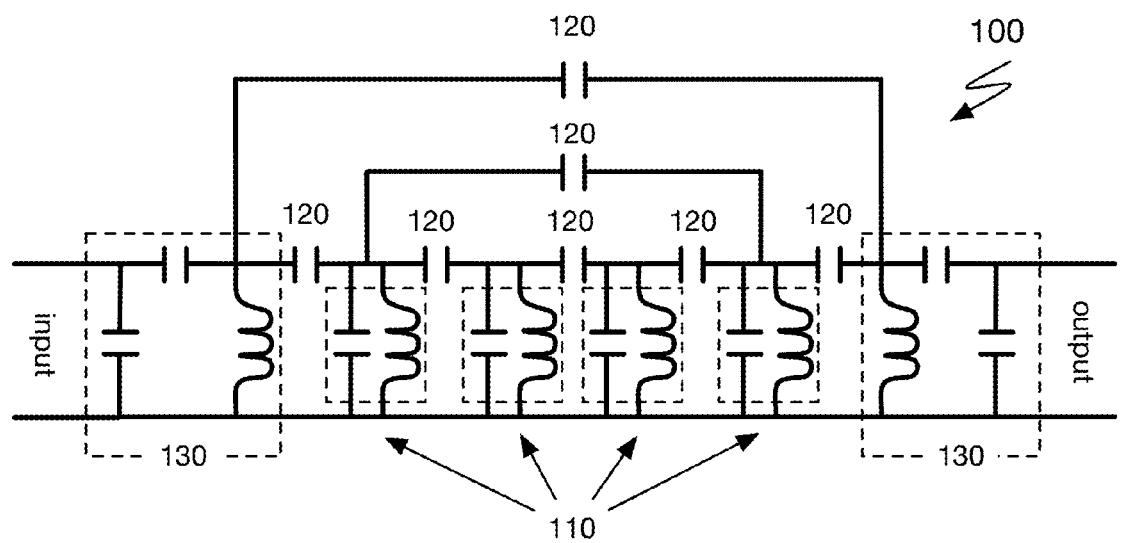
FIGS. 1A and 1B is a schematic representation of a delay filter of a preferred embodiment.
Figure 1B:
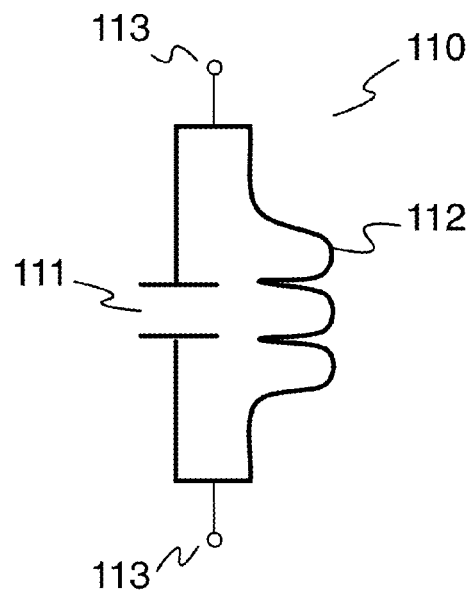

As shown in FIG. 1, a time delay filter 100 includes one or more LC resonators 110. The time delay filter 100 may additionally include intra-filter coupling elements 120 and/or input matching elements 130. The time delay filter 100 may additionally or alternatively include any number of LC resonators 110 (e.g., the set of LC resonators 110 may contain only a single LC resonator). The time delay filter 100 may additionally or alternatively include any suitable components coupled to the LC resonator(s) 110 that aid or otherwise contribute the production of a time delay, such as passive or active components (e.g., capacitors, transistors, switches, etc.), integrated components (e.g., conductive layers and/or traces), or any other suitable components.

The time delay filter 100 preferably functions to produce a substantially frequency-invariant group delay for analog signals within a particular frequency band of interest; typically a frequency band within the range of radio frequencies (RF), but alternatively any suitable frequency band in any suitable frequency range. A group delay of an analog signal will delay the amplitude envelope of each frequency component of the signal; a frequency-invariant group delay will apply an equal time delay to the amplitude envelope of each frequency component of the signal.

The time delay filter 100 can additionally or alternatively function to increase the performance of signal transceivers (or other applicable systems; e.g., phased antenna arrays) by enabling high accuracy, adjustable, and/or reconfigurable group delay of signals without prohibitive increases in circuit complexity and/or cost.

The time delay filter 100 preferably has a relatively low and frequency-invariant (in a frequency band of interest) insertion loss (e.g., 1 dB, 3 dB, or 5 dB of insertion loss and/or attenuation). In other words, the magnitude of the frequency response of the time delay filter 100 is substantially flat over the range of frequencies of interest (e.g., over the range of radio frequencies) and has a magnitude ripple that is small relative to the signal magnitude (e.g., 10×, 100x, or 1000x smaller). Alternatively, the time delay filter 100 may have any suitable insertion loss, that varies with frequency in any suitable manner.

The time delay filter 100 preferably is constructed from lumped and/or distributed inductors and capacitors that are integrated into the substrate of a laminate (e.g., a printed circuit board), of a microchip (e.g., a silicon substrate), or any other suitable circuit substrate. Integration of the time delay filter 100 may substantially reduce cost and size of the time delay filter 100.

Portions of the time delay filter may additionally or alternatively be added to the substrate as discrete components. For example, the LC resonator(s) 110 of the time delay filter 100 may be integrated into the substrate, and input matching element(s) 130 and/or intra-filter coupling element(s) 120 may be coupled to the substrate and/or the LC resonators as discrete components (e.g., via wire bonding, surface mounting, etc.).

The time delay filter 100 is preferably implemented using analog circuitry, but additionally or alternatively may be implemented by digital circuitry or any combination of analog and digital circuitry. Analog circuitry is preferably implemented using a combination of the circuit substrate and metallized/conductive layers as described above, but can additionally or alternatively be implemented using analog integrated circuits (ICs) and/or discrete components (e.g., capacitors, inductors, resistors, transistors), wires, transmission lines, transformers, couplers, hybrids, waveguides, digital components, mixed-signal components, or any other suitable components. Digital circuitry is preferably implemented using a general-purpose processor, a digital signal processor, an application specific integrated circuit (ASIC), a field programmable gate array (FPGA) and/or any suitable processor(s) or circuit(s). The time delay filter 100 is preferably preconfigured structurally to provide a given time delay or set of time delays, but may additionally or alternatively include memory to store configuration data, or be configured using externally stored configuration data or in any suitable manner.

The time delay filter 100 may include multiple coupling points 113 (i.e., points at which other circuits may couple to the time delay filter 100) to enable either or both of variable impedance of the time delay filter and variable delay of the time delay filter (as discussed in subsequent sections).

The time delay filter 100 may also alter impedance or delay of the time delay filter 100 through use of tunable elements in the LC resonators 110 or matching elements 130; i.e., as opposed to modifying impedance by coupling at a different coupling point, impedance may be modified using variable capacitors and/or inductors.

Each LC resonator 110 of the delay 100 functions to contribute a time delay to an input signal of the time delay filter 100. As shown in FIG. 1, LC resonators 110 are preferably coupled in parallel; alternatively, LC resonators 110 may be coupled in any manner. LC resonators 110 preferably include one or more coupling points 113, as shown in FIG. 11, at which other components of the time delay filter (e.g., additional resonators 110, matching elements 130, coupling elements, etc.) are coupled (e.g., electrically connected) to the resonator. Coupling may be resistive (e.g., by a wire, metallized layer, or any other suitable conductive material), capacitive (e.g., by a discrete capacitor, mutual capacitance, etc.), inductive (e.g., by a discrete inductor, mutual inductance, etc.), electromagnetic (e.g., radiative coupling), or any other suitable manner. Additionally or alternatively, LC resonators may be coupled to in any suitable manner.

The LC resonator 110 is preferably optimized to reduce the number of components required in time delay filter construction (and therefore complexity/cost of any applicable system using a time delay filter) as well as to provide low insertion loss.

Each LC resonator 110 preferably has substantially the same frequency response and produces a substantially similar time delay. Accordingly, the delay of the time delay filter is preferably approximately equal to the number of LC resonators 110 multiplied by the average time delay of the LC resonators 110. In such an implementation, the total delay experienced by a signal passing through the time delay filter may be adjustable by selecting the number of LC resonators 110 switched into the signal path. Alternatively, the time delay filter may have a number of LC resonators with different frequency responses that may produce different time delays, and in such cases the delay of the time delay filter is preferably approximately equal to the sum of the time delay of each LC resonator 110 in the signal path. Alternatively, each LC resonator 110 may have any impedance and/or any time delay, and the time delay filter 100 may have any input/output impedance and total time delay, adjustable in any suitable manner.

Each LC resonator 110 preferably includes a substantially capacitive element 111 (i.e., an element whose reactance, in a frequency band of interest, is negative) and a substantially inductive element 112 (i.e., an element whose reactance, in a frequency band of interest, is positive) placed in parallel. Alternatively, each LC resonator 110 may include any circuit elements such that the impedance of the resonator 110 is approximately characterized by:

$$Z(\omega) = -jk\frac{\omega}{\omega^2 - \omega_0^2}$$

where k is a constant $$\left(\text{in a pure } LC \text{ circuit, } k = \frac{1}{C}\right)$$

and $\omega_0$ is the resonant frequency of the resonator $$\left(\text{in a pure } LC \text{ circuit, } \omega_0 = \frac{1}{\sqrt{LC}}\right).$$

Alternatively, the LC resonator may include circuit elements that are networked together to provide any suitable total impedance that varies as a function of frequency in any suitable manner.

The LC resonator 110 is preferably constructed in a laminate or chip substrate from a combination of metallization layer strips (e.g., strip inductor, microstrip, etc.), vias (e.g., through-hole vias, partial vias, buried vias, metallized slots, etc.), and the substrate itself. Additionally, the LC resonator 110 may include high-k dielectric layers. Alternatively, the LC resonator 110 may be constructed using any suitable materials.

Figure 2A:
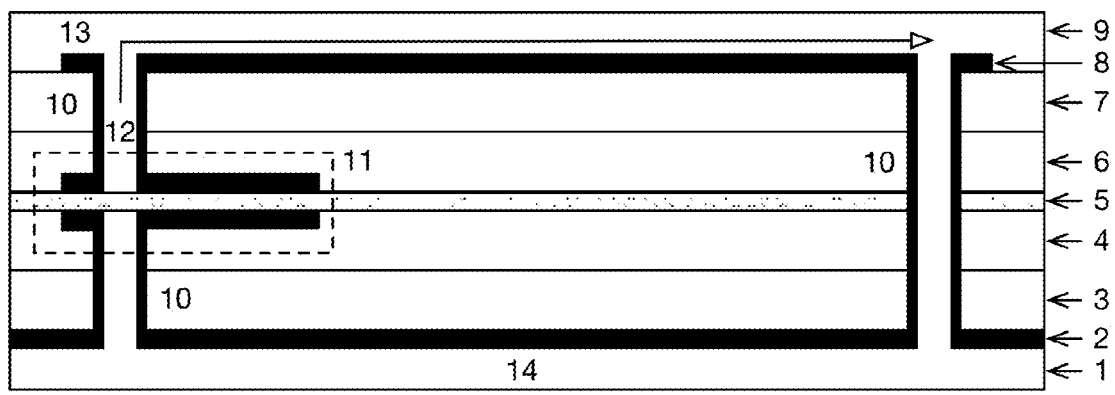
FIG. 2A is a cross-sectional example representation of a resonator of a delay filter of a preferred embodiment.
Figure 2B:
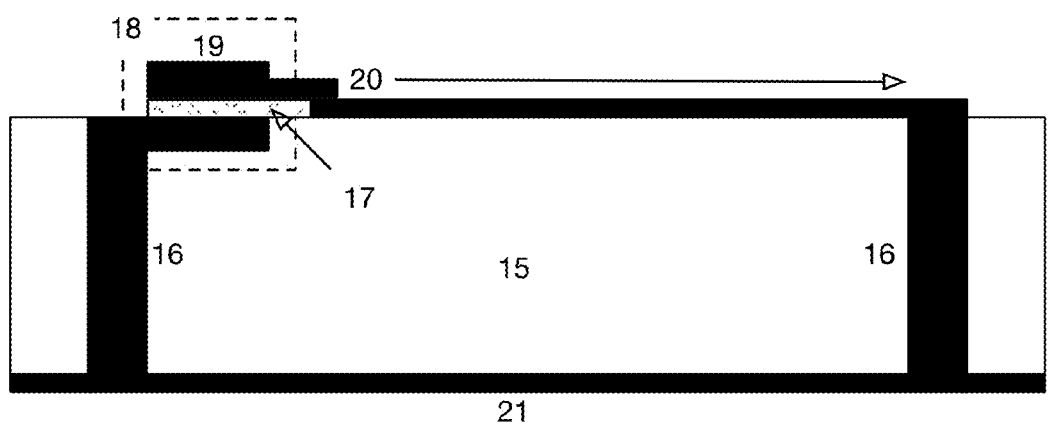
FIG. 2B is a cross-sectional example representation of a resonator of a delay filter of a preferred embodiment.
Figure 3:
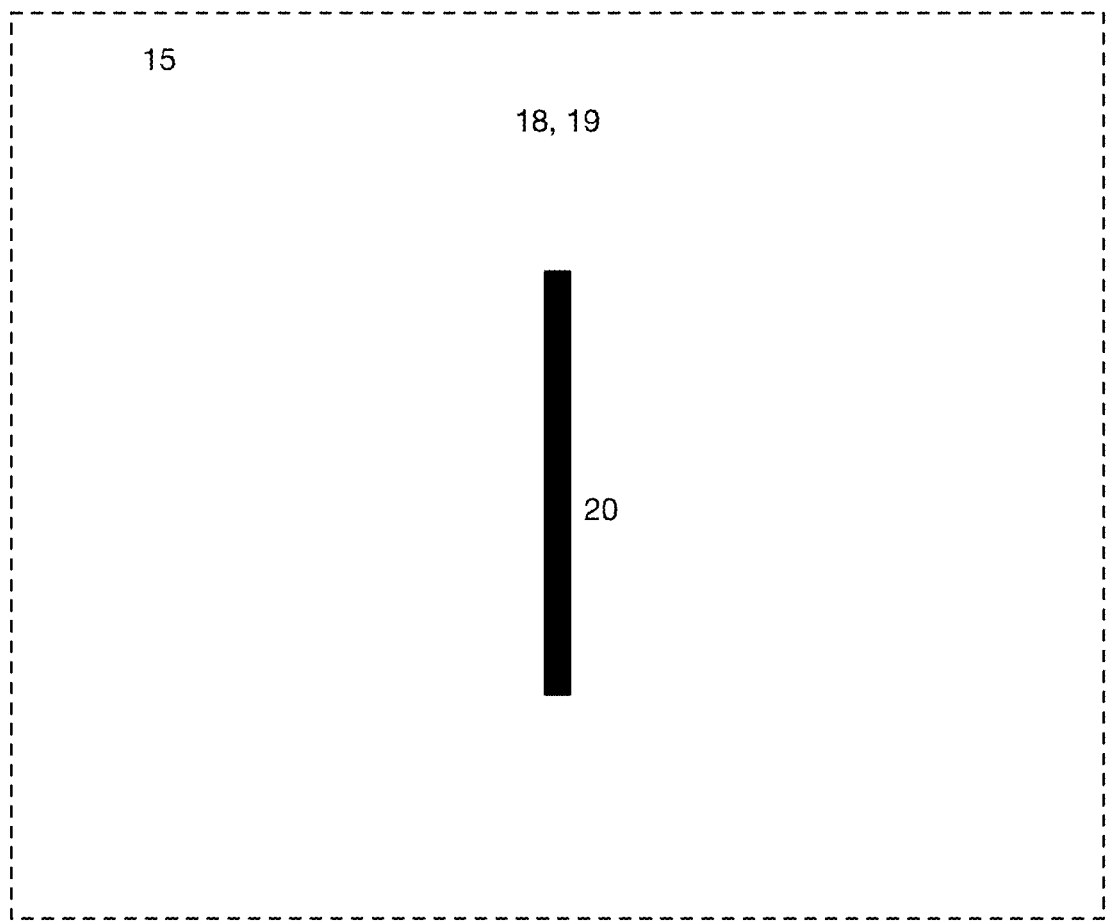
FIG. 3 is a top-down example representation of a resonator of a delay filter of a preferred embodiment.

As shown in FIGS. 2A, 2B, and 3 the LC resonator 110 is preferably constructed from a combination of a parallel plate capacitor and a strip inductor on a laminate substrate or a semiconductor/insulator chip substrate. Such a parallel plate capacitor preferably includes a first conductive planar region separated from a second conductive planar region by a dielectric material, and the first and second conductive planar regions are preferably substantially parallel (e.g., as uniformly parallel as manufacturing tolerances may permit); however, a parallel plate capacitor may additionally or alternatively include any suitable subcomponents configured in any suitable manner. Alternatively, the LC resonator 110 may be constructed from any other suitable capacitive/inductive elements (e.g., a spiral inductor or interdigitated finger capacitor). For example, an LC resonator 110 may include a braided inductive element (i.e., an inductive element comprising several inductive subelements in parallel, separated by an insulator, 'braided' or otherwise positioned near each other). Such a braided inductive element is preferably formed from layers of the substrate including regions of alternately isolative and conductive material, which, when stacked together to form the substrate, are configured into a three-dimensional braided structure. Alternatively, a braided inductive element may be formed from any suitable materials, in any suitable manner.

An example implementation of a preferred embodiment is shown in FIG. 2A (cross-sectional view). In this implementation, the LC resonator 110 is constructed on a laminate substrate, having a number of isolative layers (1, 3-7, 9) and conductive layers (2, 8). The LC resonator 110 is formed from a parallel plate capacitor 11, of which a first plate is coupled to a ground plane 14 by a conductive via 10, and a strip inductor 12, which is coupled to the second plate of the capacitor 11 by a conductive via 10 and is coupled to the ground plane 14 by another conductive via 10. The ground plane may extend over all or most of the surface of the substrate on one side, and thus extend over a greater area than the strip inductor; alternatively, the ground plane may be a second strip inductor on the opposing side of the substrate that is of substantially the same size and extent, or may alternatively extend over any other suitable area. The resonator 110 may be coupled to at coupling point 13. If constructed on a laminate substrate, the LC resonator 110 may include any number of layers made of any material. For example, in this example implementation, the resonator 110 may include epoxy prepreg layers 4 and 6; FR-4 core layers 3, 7; copper conductive layers 2, 8; and hafnium oxide high-k dielectric layer 5, with copper vias 10. The layers, vias, and elements may be of any shape, size, thickness, etc. Note that in particular the dielectric material separating the plates of the capacitor (in this case layer 5) may be a standard isolative layer (e.g., a core layer), but may alternatively be a different dielectric material (e.g., a dielectric material with higher k or otherwise suitable to serve as an insulator for the capacitor 11).

A second example implementation of a preferred embodiment is as shown in FIG. 2B (cross-sectional view) and FIG. 3 (top-down view). In this implementation, the LC resonator 110 is constructed on a semiconductor chip substrate 15. The LC resonator 110 is formed from a parallel plate capacitor 18 and a strip inductor 20, both coupled to a ground contact 21 by through-substrate vias 16. The resonator 110 may be coupled to at coupling point 19. If constructed on a semiconductor or insulator chip substrate, the resonator 110 may include any materials fabricated in any manner. For example, in this example implementation, the resonator 110 may include a silicon dioxide substrate 15, a silicon dioxide or silicon nitride capacitor dielectric pad 17, with metallic pads/traces/vias fabricated using electroplated copper or aluminum (16, 18-21; note: seed layer not pictured). Similar to the first example implementation, the capacitor dielectric may be a similar material to the substrate or may be a different material (for fabrication reasons, dielectric constant, etc.).

In a third example implementation of a preferred embodiment related to the second example implementation, the LC resonator is constructed on a semiconductor chip substrate, and the LC resonator 110 is formed from a buried parallel plate capacitor and a strip inductor. The strip inductor may be covered by an isolative layer and/or a shielding layer, which may prevent electromagnetic coupling between the strip inductor and neighboring packaged elements (e.g., strip inductors, traces, etc.). Additionally or alternatively, the resonator may be physically distanced from other packaged elements to avoid mutual electromagnetic coupling (in such example implementations and variations where mutual electromagnetic coupling is not desired).

LC resonators 110 may include multiple tapping points to enable modification of the impedance of the LC resonator 110 (as seen by coupled or matching circuits). Tapping points may also be referred to as coupling points, and may perform the same function; alternatively, they may perform different functions. Additionally or alternatively, tapping of the resonator may be used to modify impedance, time delay, resonance frequency, etc.

Figure 4A:
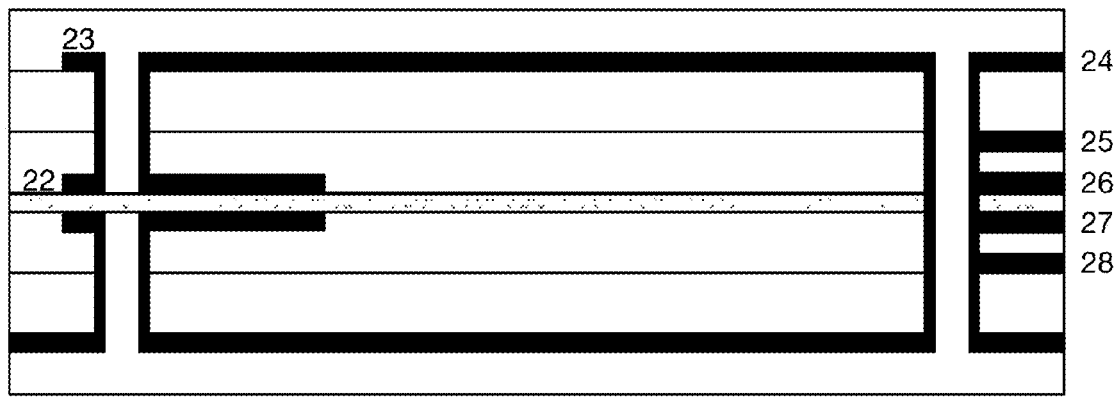
FIG. 4A is a cross-sectional example representation of a resonator of a delay filter of a preferred embodiment.
Figure 4B:
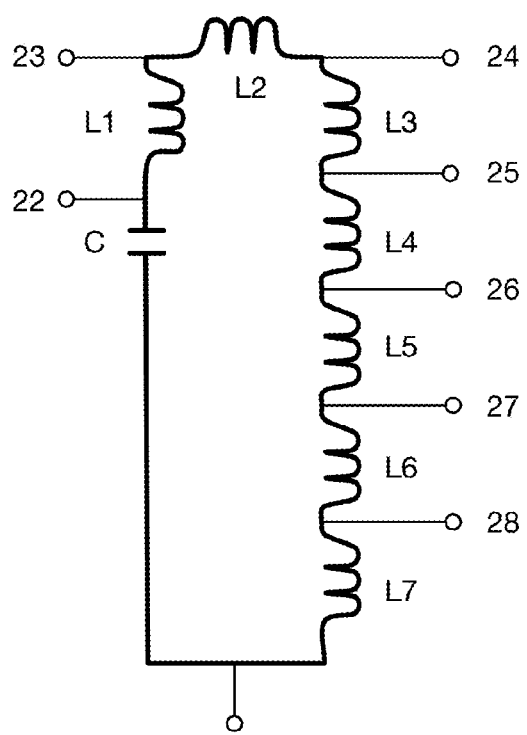
FIG. 4B is a circuit representation of a resonator of a delay filter of a preferred embodiment.

For example, as shown in FIG. 4A, the inductor of the LC resonator 110 may include multiple tapping points 22-28. An equivalent circuit of this example is as shown in FIG. 4B. A tapping point of an inductor or inductive element may include conductive layers of the substrate that extend to a point along a portion of the inductor that passes through the substrate (e.g., to a point along a via that comprises a portion of the resonator). In this example, the inductance of the total inductor (as seen by a coupling element or experienced by a signal passing through the resonator) is variable depending on the point along the conductive path at which a signal is sampled from, or, similarly, the point at which a tap is physically and electrically coupled to the conductive path. The inductance, and thus the frequency response and/or time delay, may be varied by sampling the signal (or coupling to the resonator) at various tapping points.

Figure 5A:
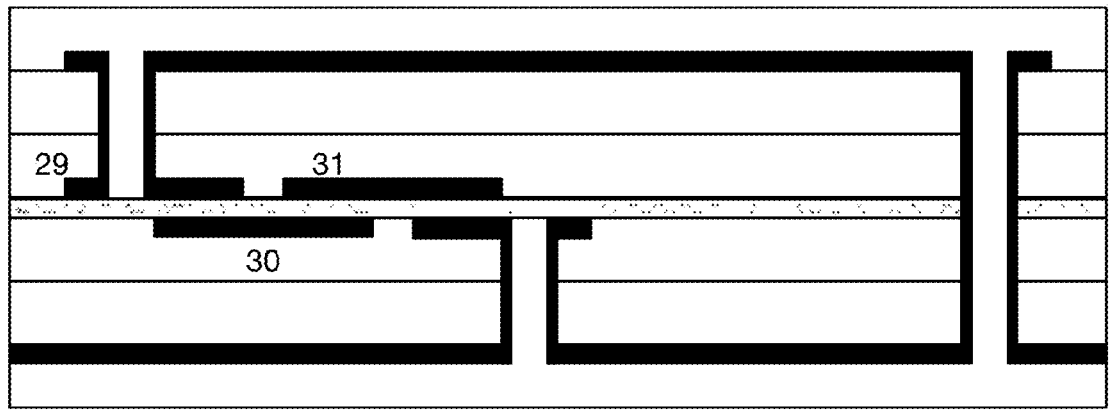
FIG. 5A is a cross-sectional example representation of a resonator of a delay filter of a preferred embodiment.
Figure 5B:
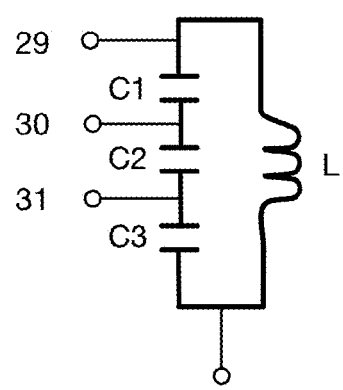
FIG. 5B is a circuit representation of a resonator of a delay filter of a preferred embodiment.

As another example, as shown in FIG. 5A, the capacitor of the LC resonator 110 may include multiple tapping points 29-31. An equivalent circuit of this example is as shown in FIG. 5B. In example implementation, the capacitor includes two conductive planar regions that are subdivided into electrically isolated subregions, as shown in FIG. 5A. Each of these subregions is coupled to a tapping point, and the division of the capacitive element into multiple capacitive subelements in this manner can enable variation of the capacitance of the LC resonator as seen by coupled elements or signals passing through the LC resonator (by variation of the tapping point at which elements are coupled to the multi-tapped LC resonator). Selection of the variable capacitance is preferably performed in a similar manner as for a multi-tapped inductor as described above, but can additionally or alternatively be performed in any suitable manner.

Multiple tapping points allow for either varying the impedance of the resonator and/or generating a differential signal from a single ended input signal (e.g. when using both tapping points around C2 in FIG. 5B). An LC resonator 110 may include multiple tapping points on both the capacitive element and the inductive element.

If a component of an LC resonator 110 includes multiple tapping points, they may be coupled to in any manner. For example, a switch (e.g., a transistor) may be coupled between a resonator 110 input and multiple tapping points, enabling a selection of tapping points. As another example, a switch may be coupled between tapping points, allowing those tapping points to be shorted (e.g., a switch between tapping points 30 and 31 could enable selective shorting of C2).

If a component of an LC resonator 110 includes multiple tapping points and a coupling point at which it is coupled to other LC resonators (e.g., resistively coupled, capacitively coupled, inductively coupled, electromagnetically coupled), they may be selectively coupled in any suitable manner. For example, a set of switches (e.g., transistors, a multi-input/single-output multiplexer, etc.) may be coupled between the tapping points (taps) and the coupling point, enabling selection and/or adjustment of the impedance of the resonator as seen by components (e.g., resonators 110, matching elements 130) coupled to the coupling point.

Figure 6A:
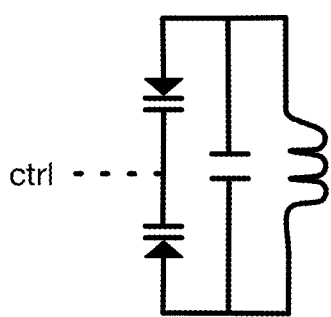
FIG. 6A is a circuit representation of a tunable resonator of a delay filter of a preferred embodiment.
Figure 6B:
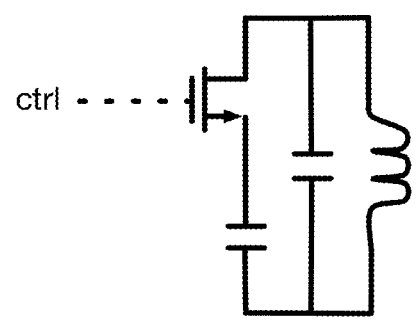
FIG. 6B is a circuit representation of a tunable resonator of a delay filter of a preferred embodiment.

In addition to having tapping points, LC resonators 110 may integrate or be coupled to tunable circuit elements (e.g., capacitors, inductors, transistors, resistors) to change their tuning properties. Some examples of tunable LC resonators 110 are as shown in FIGS. 6A and 6B. As shown in FIG. 6A, the LC resonator 110 may include one or more varactors in parallel with the LC resonator 110, enabling a tunable capacitance of the resonator. As shown in FIG. 6B, the LC resonator 110 may include a single or multitude of capacitor-transistor series combinations, which allow tuning of the capacitance of the LC resonator 110 via different permutations of transistors being switched on or off. In another embodiment the capacitor in the capacitor-transistor series combination may be replaced with a varactor to reduce the number of switches needed or increase the resolution of the tuning.

Tuning of the LC resonators (and hence the delay filter) may also be done permanently at the end of the manufacturing process by adding (e.g. by way of 3D metal printing) or removing (e.g. milling) material from traces, inductor or the plate of any capacitor in the circuit. Alternatively capacitors and/or inductors may be tuned by blowing small fuses implemented as traces in the substrate.

As previously described, LC resonators 110 of the delay filter 100 are preferably coupled in parallel to form the delay filter 100 (or part of the delay filter 100). While LC resonators 110 may be coupled in any manner (e.g., resistively), LC resonators 110 are preferably coupled to each other capacitively (using capacitive intra-filter coupling elements 120) and/or inductively (by positioning inductors of LC resonators 110 to enable magnetic coupling between the inductors) or in any combination of the 3 coupling methods (e.g. 50% capacitive and 50% inductive).

Intra-filter elements 120 function to couple LC resonators 110 of the delay filter 100. Similarly to components of the LC resonator 110, intra-filter elements are preferably passive capacitive, resistive, and/or inductive elements, but intra-filter elements may be any active or passive components capable of coupling LC resonators 110. Intra-filter elements 120 are preferably constructed from a combination of metallization layer strips, vias, and the substrate, but may additionally or alternatively be constructed in any manner. For example, a capacitive intra-filter element 120 may be a packaged capacitor surface-mounted to a substrate containing the LC resonators 110. As another example, a capacitive intra-filter element 120 may be constructed in a substantially similar manner to a capacitor of an LC resonator 110.

Figure 7A:
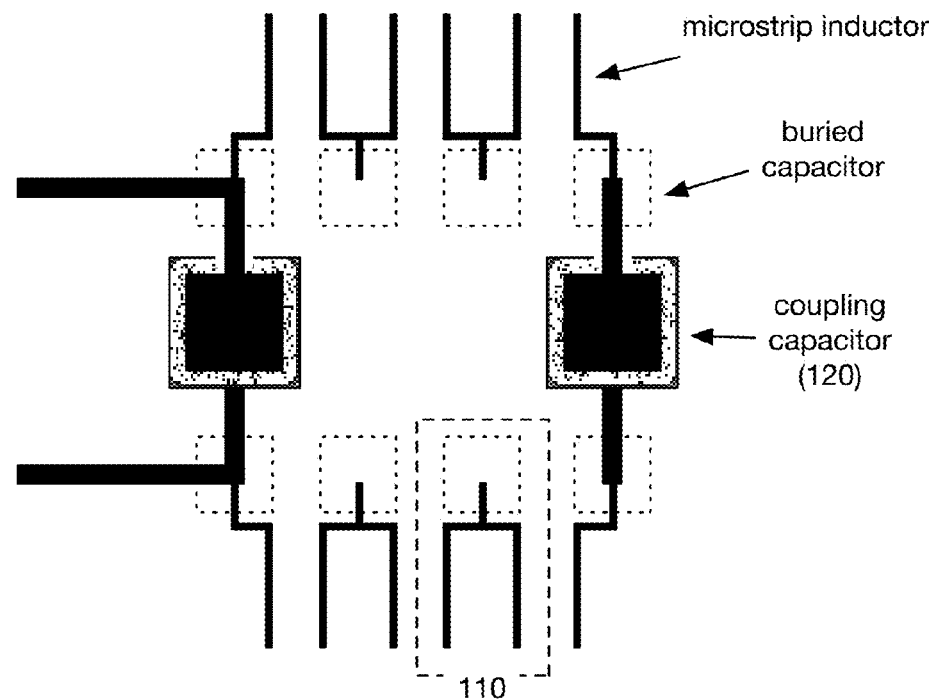
FIG. 7A is a top-down example representation of a delay filter of a preferred embodiment.
Figure 7B:
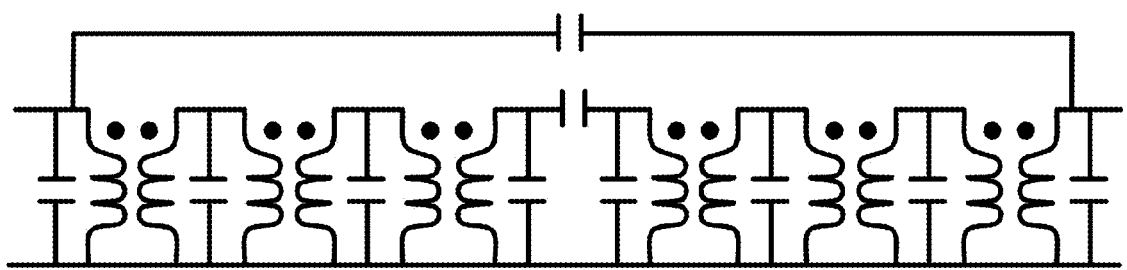
FIG. 7B is a circuit representation of a delay filter of a preferred embodiment.

As shown in a top-down view in FIG. 7A, an example delay filter 110 includes LC resonators 110 coupled both capacitively and inductively. An equivalent circuit model is as shown in FIG. 7B. In this example, the coupling capacitors are mounted to the surface of the substrate whereas the buried capacitors associated with each LC resonator are embedded within the substrate. Alternatively, the coupling capacitors may be similarly embedded, or may be otherwise suitably configured. In this example, the microstrip inductors of a subset of the resonators include two distinct conductive regions that extend across a surface of the substrate, and are separated laterally on the surface. Inductive coupling (e.g., by way of mutual inductance) between resonators is accomplished in this example by one of the laterally-separated portions of the inductor of one resonator coupling with one of the portions of the inductor of another resonator. The bilateral configuration of this example provides for inductive coupling with a resonator positioned at either lateral position neighboring the resonator.

Figure 8A:
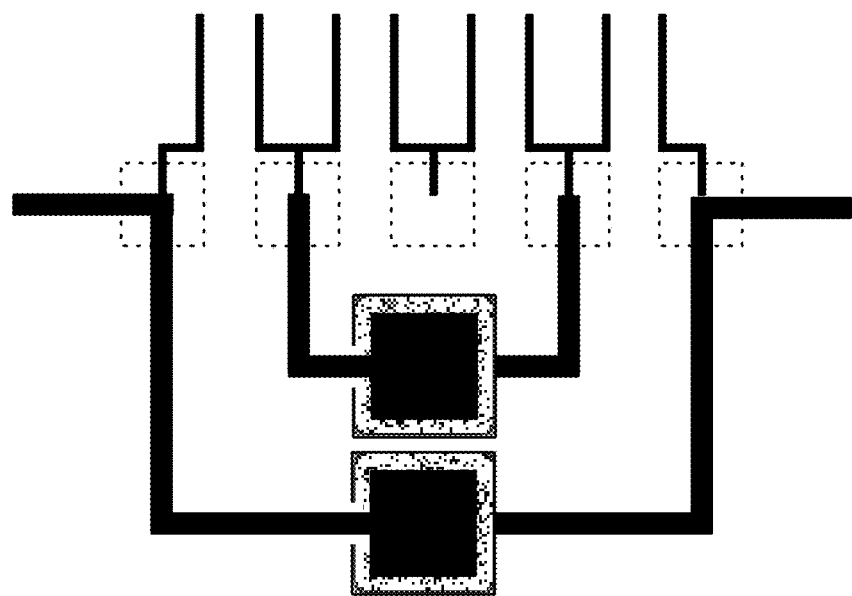
FIG. 8A is a top-down example representation of a delay filter of a preferred embodiment.
Figure 8B:
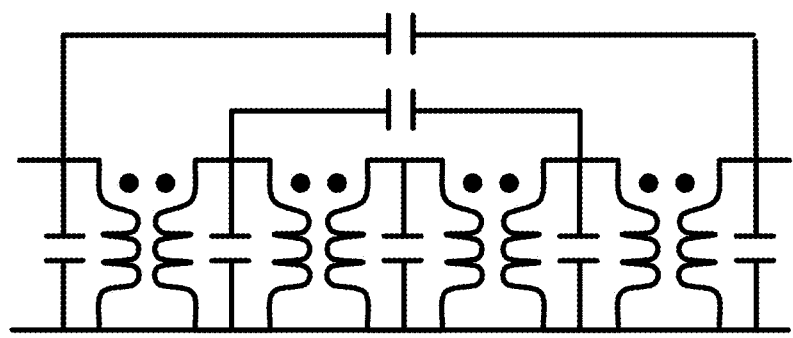
FIG. 8B is a circuit representation of a delay filter of a preferred embodiment.

As shown in a top-down view in FIG. 8A, a second example delay filter 110 also includes LC resonators 110 coupled both capacitively and inductively. An equivalent circuit model is as shown in FIG. 8B.

Inductive coupling is preferably accomplished by placing microstrip inductors in proximity to each other, but may additionally or alternatively be accomplished in any manner. For example, inductors of separate LC resonators 110 may be braided or otherwise positioned to accomplish inductive coupling between the LC resonators 110. Note that inductive coupling may include electromagnetic coupling between inductors that are not in direct electric contact (e.g., the changing magnetic flux generated by current flowing through one inductor or inductive element may induce a current in another inductor or inductive element); it may additionally or alternatively include direct electrical coupling of an inductor between two inductors, that are thereby inductively coupled.

Input matching elements 130 function to couple LC resonators 110 to an input and/or output of the delay filter 100 with the desired impedance. Input matching elements 130 preferably include circuits comprising passive capacitive, resistive, and/or inductive elements, but input matching elements 130 may be any active or passive combination of components (including trace or microstrip components) capable of coupling the delay filter 100 to an external circuit. Input matching elements 130 are preferably constructed from a combination of metallization layer strips, vias, and the substrate, but may additionally or alternatively be constructed in any manner. For example, an input coupling element 130 may comprise a circuit of packaged capacitors and inductors surface-mounted to a substrate containing the LC resonators 110. As another example, components of an input coupling element 130 may be constructed in a substantially similar manner to those of an LC resonator 110. Similar to LC resonators 110, input matching elements 130 may incorporate tapped or otherwise tunable capacitive and/or inductive elements. In another embodiments the input coupling element may incorporate tunable resistors.

Figure 9:
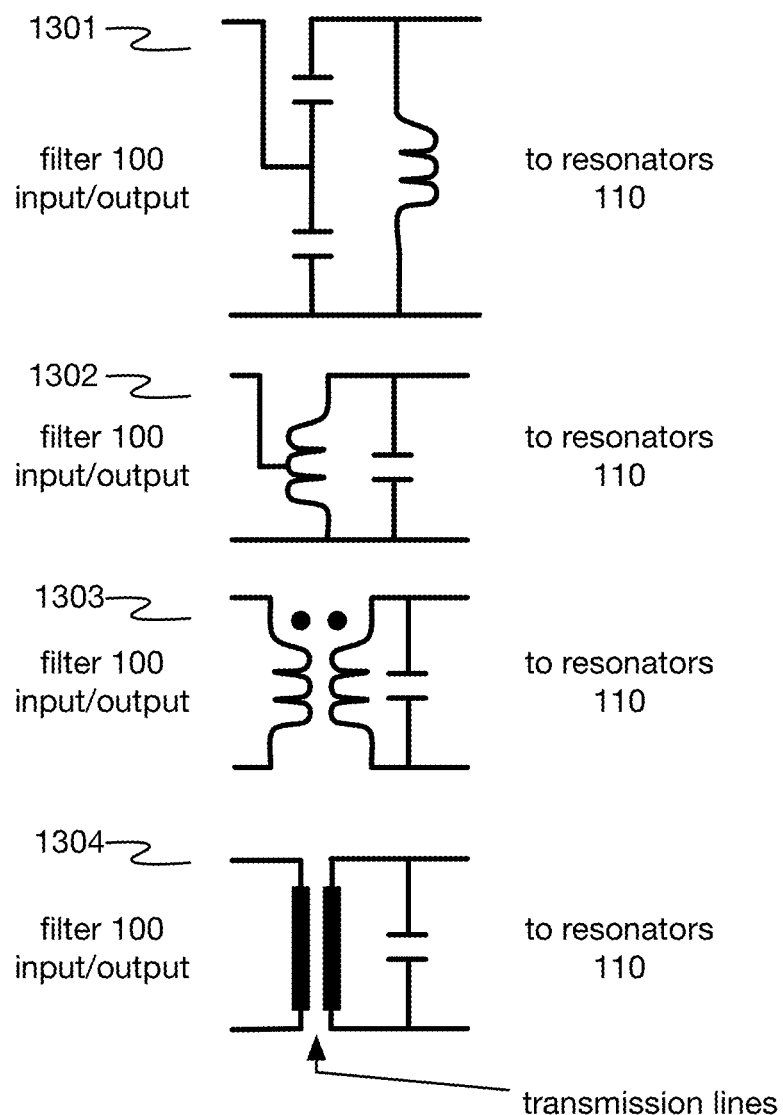
FIG. 9 is a circuit representation of input and output matching elements of a delay filter of a preferred embodiment.

Some examples of input matching elements 130 are as shown in FIG. 9. As shown in FIG. 9, example filters 100 may be coupled to using a tapped capacitor LC resonator-based coupler 1301, a tapped inductor LC resonator-based coupler 1302, an inductively-coupled LC resonator-based coupler 1303, and/or a transmission line coupler 1304.

While input matching elements 130 may be independent of LC resonators 110, additionally or alternatively, input matching elements 130 may be merged (partially or fully) with resonators 110 of the filter 100. For example, the LC resonator 110 may include an additional capacitive and/or inductive element, in parallel or in series with the primary capacitive and inductive elements, that may function as an input matching element 130.

Figure 10A:
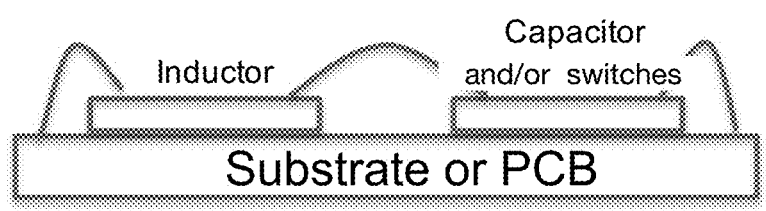
FIG. 10A is a side view representation of a delay filter of a variation of a preferred embodiment.

In a variation of a preferred embodiment, inductors and capacitors of LC resonators 110 of the delay filter 100 are separated onto separate chips, dies, and/or substrates and are coupled by wire-bonding, traces on an underlying substrate, flip-chip bonding, or some other technique. Some examples of this separation as shown in FIG. 10A.

Figure 10B:
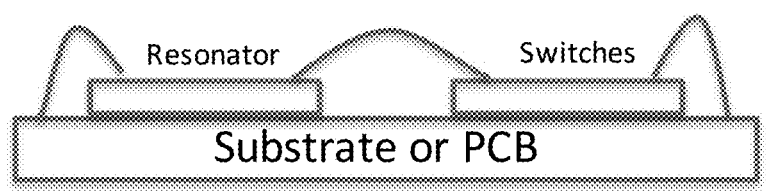
FIG. 10B is a side view representation of a delay filter of a variation of a preferred embodiment.

Likewise, if the delay filter 100 includes switches (e.g., to switch between taps of tapped inductors/capacitors), the switches may be isolated from resonators and coupled by wire-bonding, traces on an underlying substrate, flip-chip bonding, or some other technique, as shown in FIG. 10B.

The delay filter 100 may comprise any number of switches, and switches (or a set of switches) may be any suitable components capable of selectively coupling the taps and/or coupling points of resonators 110 or other components to circuit common rails, grounds, and/or circuit inputs/outputs. For example, switches may include mechanical switches, mechanical relays, solid-state relays, transistors, silicon controlled rectifiers, triacs, and/or digital switches. Switches of the set of switches may be operable electronically by a tuning circuit or other suitable controller, but may additionally or alternatively be set in any manner. For example, switches may be manually set by a circuit user. As another example, switches may be one-time-use junctions that are configured into a desired configuration when the delay filter 100 is manufactured (e.g., by soldering, annealing, fusing, or any other suitable manner of irreversible configuration), resulting in a desired overall delay filter 100 configuration (e.g., group delay value).

Switches are preferably operable between one or more switch states, in which a state of the switch corresponds to coupling between two or more system components. For example, a switch (e.g., transistor) may be operable in a first switch state that couples a first tapping point to a coupling point of a resonator, and in a second switch state that couples a second tapping point to a coupling point of a resonator. In another example, a switch may be operable in a first switch state that couples one of a set of resonators to a common rail (e.g., a ground plane) of the system, in order to place it in the signal path of a signal passing through the time delay filter; this switch may be operable in a second switch state that decouples the resonator from the common rail, thereby removing the resonator from the signal path (and reducing the overall time delay applied by the time delay filter).

As shown in FIGS. 10A and 10B, separate chips/dies may be laterally separated on a substrate, but additionally or alternatively, they may be stacked vertically (or in any other manner). Coupling between circuit elements may be between elements on either the same or separate chips. For example, inductors on a first printed circuit board may be magnetically coupled to inductors on a second printed circuit board in cases in which the two PCBs are positioned so as to bring the inductors (between which magnetic coupling is desired) into close proximity. Additionally or alternatively, other three-dimensional configurations of circuit elements may be leveraged to achieve electromagnetic coupling in any suitable manner.

In an example implementation of a preferred embodiment, the time delay filter includes a substrate and an LC resonator. The substrate is a laminated circuit board that is comprised of several layers and has two broad, substantially parallel outer surfaces (e.g., a top and bottom surface, though the substrate may be in any suitable orientation). The resonator includes a capacitive element and an inductive element, coupled together into an LC circuit that is connected in parallel between a conductive contact point (e.g., a coupling point) on the first surface and a ground plane (e.g., a conductive region) on the second surface. The inductive element is a strip inductor that is formed by a conductive region (e.g., a metallized strip) on the first surface, and connected to the capacitive element and the ground plane by a pair of conductive vias. The first via is a through-hole via passing through the substrate (e.g., through several isolative and/or conductive layers of the substrate) to the ground plane, and the second via is a partial via that passes through the substrate to an intermediate position within the substrate where the capacitive element is located. There is also a third via that passes through the substrate between the capacitive element and the ground plane, and is directly electrically connected (e.g., soldered) to both. The capacitive element, which may be a parallel plate capacitor or any other suitable capacitive element, completes the LC circuit while interrupting the continuous conductive region (e.g., by way of a dielectric barrier between two sides, such as parallel plates, of the capacitive element). Together, the strip inductor, the first, second, and third vias, the capacitor, and the ground plane form a loop. This loop encloses an area that defines a normal axis, and the normal axis is substantially parallel to the plane(s) of the surfaces of the substrate; in other words, the conductive loop passes through the substrate in two locations (in this example, the locations of the vias) and lies adjacent to the substrate on two contralateral sides of the substrate.

In variations of a preferred embodiment, the LC resonators 110 may have a certain inductance and capacitance per unit length that repeats in a harmonic fashion over the length of the resonator, and the time delay filter 100 may therefore be well-represented using a distributed inductor and capacitor model (e.g., a transmission line model). In other variations, the LC resonators 110 may be formed from localized discrete components (e.g., ceramic capacitors, wound-wire inductors) such that the time delay filter 100 is well-represented using a lumped-element model. In still further variations including a plurality of LC resonators, a subset of LC resonators may be represented by a distributed model and another subset of LC resonators may be represented by a lumped element model.

Figure 11A:
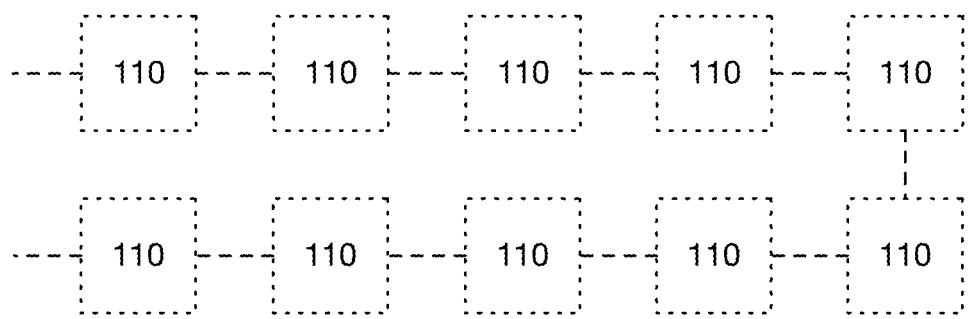
FIGS. 11A-C are circuit representations of LC resonator arrangements of a delay filter of a preferred embodiment.
Figure 11B:
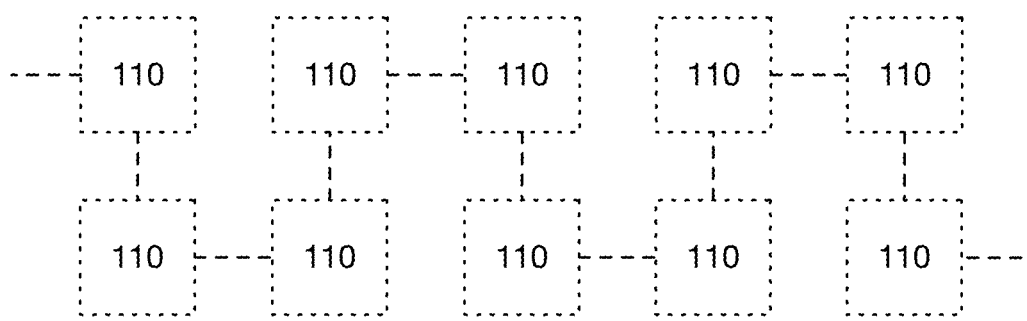
Figure 11C:
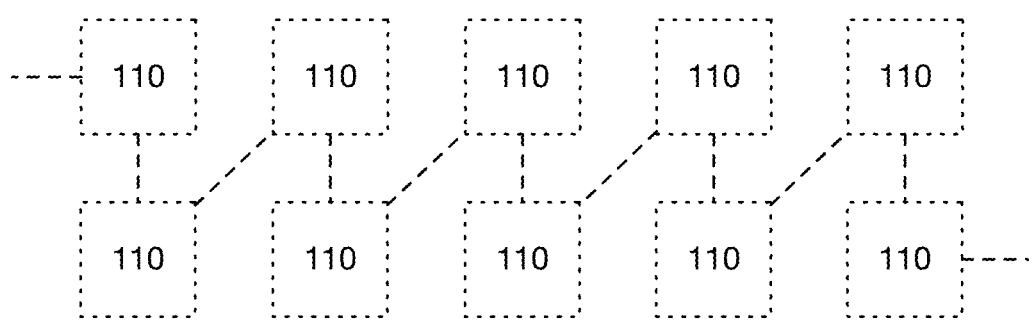

Note that in many cases, the positioning of resonators relative to one another and the coupling between resonators 110 (whether it be capacitive, magnetic, or both) may play into the performance of the filter 100. For example, as shown in FIG. 11A, resonators may be coupled in a large horseshoe pattern (similar to the magnetic coupling of FIGS. 7A and 8A). Alternatively, as shown in FIGS. 11B and 11C, resonators may be coupled in a meander pattern or a zigzag pattern (respectively). Resonators 110 may be positioned and coupled in any manner.

As a person skilled in the art will recognize from the previous detailed description and from the figures and claims, modifications and changes can be made to the preferred embodiments of the invention without departing from the scope of this invention defined in the following claims.

We claim:

1. A time delay filter comprising:
   a substrate comprising a first isolative layer, the first isolative layer comprising a first surface and a second surface, the second surface substantially parallel to the first surface;
   a resonator, comprising a capacitive element coupled to an inductive element, the inductive element comprising:

a first conductive region coupled to the first surface of the first isolative layer, a second conductive region coupled to the second surface of the first isolative layer, a first via that is electrically coupled to and extends between the first and second conductive region;

a second via that is electrically coupled to and extends between the first conductive region and a first portion of the capacitive element;

a third via that is electrically coupled to and extends between the second conductive region and a second portion of the capacitive element;

wherein the first conductive region, the first via, the second conductive region, the second via, the capacitive element, and the third via form a loop;

a first coupling point, electrically coupled to the first conductive region of the resonator; and a second coupling point, electrically coupled to the second conductive region of the resonator.

2. The system of claim 1, wherein the first portion of the capacitive element comprises a first conductive planar region, the second portion of the capacitive element comprises a second conductive planar region, and the first and second portions are substantially parallel.

3. The system of claim 2, wherein the first and second sides of the capacitive element are separated by a dielectric layer of the substrate, wherein the dielectric layer comprises hafnium oxide.

4. The system of claim 2, wherein the first conductive planar region comprises a first and second subregion, wherein the first and second subregions are electrically isolated; wherein the second conductive planar region comprises a third and fourth subregion, wherein the third and fourth subregions are electrically isolated; and wherein a projected area of third subregion overlaps a projected area of the first subregion and overlaps a projected area of the second subregion.

5. The system of claim 4, further comprising a first and second tapping point, wherein the first tapping point is electrically coupled to the third subregion and the second tapping point is electrically coupled to the second subregion.

6. The system of claim 5, wherein the substrate comprises a conductive layer between the first and second surfaces, and wherein the conductive layer is electrically coupled to the first via at a point between the first surface and the second surface; and further comprising a third tapping point electrically coupled to the conductive layer.

7. The system of claim 1, wherein the first conductive region comprises a strip inductor that extends over a first area of the first surface, and wherein the second conductive region comprises a ground plane that extends over a second area of the second surface, wherein the second area is greater than the first area.

8. The system of claim 1, wherein the substrate comprises a conductive layer between the first and second surfaces of the isolative layer, and wherein the conductive layer is electrically connected to the first via at a point between the first surface and the second surface; and further comprising a tapping point electrically connected to the conductive layer.

9. The system of claim 8, further comprising a second tapping point electrically connected to the first via at a second point between the first surface and the second surface, and a switch that resistively couples the first tapping point and the first coupling point when in a first switch state and resistively couples the second tapping point to the first coupling point when in a second switch state.

10. A time delay filter comprising:
a substrate comprising a first surface and a second surface opposite the first surface; wherein the first surface comprises a first conductive region;
a first LC resonator coupled to the substrate and comprising:
a first coupling point,
a first capacitive element electrically coupled between the first coupling point and the first conductive region, and
a first inductive element electrically coupled between the first coupling point and the first conductive region, and comprising:
a first and second inductor tap;
a second conductive region coupled to the second surface,
a first via that is electrically connected to and extends between the first and second conductive regions;
a second via that is electrically connected to and extends between the first conductive region and a first portion of the capacitive element;
wherein the first and second inductor taps are resistively coupled to the second via; and
a third via that is electrically connected to and extends between the second conductive region and a second portion of the capacitive element;
wherein the first conductive region, the first via, the second conductive region, the second via, the capacitive element, and the third via define a loop;
a first switch that couples the first inductor tap to the first coupling point when in a first switch state and couples the second inductor tap to the first coupling point when in a second switch state;
wherein the inductive element has a first inductance when the first switch is in the first switch state and a second inductance when the first switch is in the second switch state; and
a second LC resonator coupled to the substrate and comprising:
a second coupling point,
a second capacitive element electrically coupled between the second coupling point and the first conductive region, and
a second inductive element electrically coupled between the second coupling point and the first conductive region;
wherein the system group delays a signal output at the second coupling point relative to a signal input at the first coupling point.

11. The system of claim 10, wherein the first and second LC resonators are electrically connected in parallel between an input matching element and an output matching element.

12. The system of claim 10, wherein the first and second LC resonators have identical frequency responses.

13. The system of claim 10, further comprising a tunable capacitor, coupled between the first coupling point and the second coupling point.

14. The system of claim 10, wherein the first and second coupling points are resistively coupled.

15. The system of claim 10, wherein, during operation, the first inductive element of the first LC resonator is electromagnetically coupled to the second inductive element of the second LC resonator.

16. The system of claim 15, further comprising a capacitive element, electrically coupled between the first coupling point and the second coupling point.

17. The system of claim 10, wherein the first inductive element comprises a plurality of inductive subelements connected in parallel, wherein the plurality of inductive subelements are in a braided configuration.

18. The system of claim 10, further comprising: a third LC resonator, coupled to the substrate and electrically coupled to the first conductive region and comprising a third inductive element, a third capacitive element, and a third coupling point; and a fourth LC resonator, coupled to the substrate and electrically coupled to the first conductive region and comprising a fourth inductive element, a fourth capacitive element, and a fourth coupling point.

19. The system of claim 18, wherein a first capacitor is coupled between the first coupling point and the fourth coupling point; wherein the first inductive element and second inductive element are electromagnetically coupled during operation; wherein a second capacitor is coupled between the second coupling point and the third coupling point; and wherein the third inductive element and the fourth inductive element are electromagnetically coupled during operation.

* * * * *